US007385247B2

(12) United States Patent
Rhee et al.

(10) Patent No.: US 7,385,247 B2
(45) Date of Patent: Jun. 10, 2008

(54) AT LEAST PENTA-SIDED-CHANNEL TYPE OF FINFET TRANSISTOR

(75) Inventors: Hwa-Sung Rhee, Gyeonggi-do (KR); Hyun-Suk Kim, Gyeonggi-do (KR); Ueno Tetsuji, Gyeonggi-do (KR); Jae-Yoon Yoo, Seoul (KR); Seung-Hwan Lee, Seoul (KR); Ho Lee, Gyeonggi-do (KR); Moon-han Park, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 171 days.

(21) Appl. No.: 10/986,018

(22) Filed: Nov. 12, 2004

(65) Prior Publication Data

US 2005/0156202 A1 Jul. 21, 2005

(30) Foreign Application Priority Data

Jan. 17, 2004 (KR) ...................... 10-2004-0003568

(51) Int. Cl.
*H01L 29/78* (2006.01)
(52) U.S. Cl. .............................. 257/329; 257/E29.262; 257/E29.264; 438/268; 438/283
(58) Field of Classification Search ................ 438/268, 438/269, 283; 257/365, 329, 328, E29.262, 257/E29.264
See application file for complete search history.

(56) References Cited

U.S. PATENT DOCUMENTS 4,648,173 A * 3/1987 Malaviya .................... 438/151

5,612,230 A 3/1997 Yuzurihara et al.
6,458,662 B1 10/2002 Yu
6,475,890 B1 * 11/2002 Yu .............................. 438/574
6,562,665 B1 * 5/2003 Yu .............................. 438/149
6,642,090 B1 * 11/2003 Fried et al. .................. 438/164

(Continued)

FOREIGN PATENT DOCUMENTS

WO    WO 03/003442 A    1/2003

OTHER PUBLICATIONS

Seung-Hyun Lim, "Isotropic/Anisotropic Selective Epitaxial Growth (SEG) of Si on LOCOS Patterned Si (100 Substrate by Cold Wall Ultrahigh Vacuum Chemical Vapor Disposition (UHV-CVD)," School of Materials Science and Engineering, and Inter-university Semiconductor Research Center (ISRC), Seoul Nat'l Univ., Seoul, Korea; www.samsung.comb/AboutSamsung/Social commitment/Humantech Thesis/downloads/9th.g3.pdf.

(Continued)

*Primary Examiner*—Bradley Baumeister
*Assistant Examiner*—Steven J Fulk
(74) *Attorney, Agent, or Firm*—Harness, Dickey & Pierce, P.L.C.

(57) ABSTRACT

An at least penta-sided-channel type of FinFET transistor may include: a base; a semiconductor body formed on the base, the body being arranged in a long dimension to have source/drain regions sandwiching a channel region, at least the channel, in cross-section transverse to the long dimension, having at least five planar surfaces above the base; a gate insulator on the channel region of the body; and a gate electrode formed on the gate insulator.

27 Claims, 11 Drawing Sheets

U.S. PATENT DOCUMENTS

| | | |
|---|---|---|
| 6,645,797 B1 | 11/2003 | Buynoski et al. |
| 6,656,845 B2 * | 12/2003 | Lee et al. .................... 438/700 |
| 6,853,031 B2 * | 2/2005 | Liao et al. ................... 257/328 |
| 7,045,401 B2 * | 5/2006 | Lee et al. .................... 438/157 |
| 2003/0042531 A1 | 3/2003 | Lee et al. |
| 2003/0151077 A1 | 8/2003 | Mathew et al. |
| 2003/0227036 A1 | 12/2003 | Sugiyama et al. |
| 2004/0108559 A1 | 6/2004 | Sugli et al. |
| 2004/0150029 A1 * | 8/2004 | Lee ............................ 257/308 |

OTHER PUBLICATIONS

Xiong W. et al.: "Corner effect in multiple-gate SOI MOSFETs", 2003 IEEE International SOI Conference Proceedings, Newport Beach, CA, Sep. 29-Oct. 2, 2003, IEEE International SOI Conference, New York, NY : IEEE, US, Sep. 29, 2003, pp. 111-113.

Yang F-L et al.: "Strained FIP-SOI (FINFET/FD/PD-SOI) for Sub-65 NM CMOS Scaling", 2003 Symposium on VLSI Technology, Digest of Technical Papers, Kyoto, Japan, Jun. 10-12, 2003, Symposium on VLSI Technology, New York, NY : IEEE, US, Jun. 10, 2003, pp. 137-138.

\* cited by examiner

AT LEAST PENTA-SIDED-CHANNEL TYPE OF FINFET TRANSISTOR

CROSS-REFERENCE TO RELATED APPLICATIONS

This U.S. non-provisional patent application claims priority under 35 U.S.C. § 119 of Korean Patent Application 2004-3568 filed on Jan. 17, 2004, the entire contents of which are hereby incorporated by reference.

BACKGROUND OF THE PRESENT INVENTION

The need to reduce transistor size is a perennial problem to be solved in the art of integrated circuits. One way that the Background Art reduced transistor size was to reduce the length of the channel. Doing so effectively reduced the overall footprint of the transistor. But then a minimum channel length (relative to other physical parameters of the transistor) was achieved below which problems were created, e.g., short channel effects.

The Background Art responded by developing a transistor architecture that reduced the transistor's footprint size while maintaining at least the minimum channel length. The solution can be explained via analogy to an inchworm. FIGS. 5A-5B are side views that depict stages of the peculiar form of locomotion used by an inchworm 602. In FIG. 5A, a head 604 and a tail 606 of inchworm 602 are close together while a middle section 608 thereof is hunched upward (or, in other words, folded almost in half. In FIG. 5B, inchworm 602 has moved its head 604 forward while keeping its tail 606 in the same position as in FIG. 5A, which causes middle section 608 to be stretched horizontally relative to FIG. 5A. In FIG. 5C, inchworm 602 has kept its head 604 in the same position as in FIG. 5B, but has moved its tail 606 to again be located near its head 604. As such, inchworm 602 has adopted in FIG. 5C the same posture as in FIG. 5A.

The larger footprint transistor architecture according to the Background Art is analogous to the posture of inchworm 602 in FIG. 5B, where the channel corresponds to the horizontally stretched middle section 608 of inchworm 602. The smaller footprint transistor architecture according to the Background Art is analogous to the posture of inchworm 602 in FIGS. 5A and 5C, where the channel corresponds to the hunched-upward or folded middle section 608.

FIG. 6 is a three-quarter perspective view of the smaller footprint architecture according to the Background Art, which is generally referred to as a FinFET and particularly here as a triple gate FinFET 700, i.e., FET having a channel in the shape of a fin 702b (obscured in FIG. 6 but see FIG. 7) formed on a buried oxide (BOX) structure 701 between a source region 702a and a drain region 702C. Gate electrode 706 conforms (as does interposed gate oxide layer 704) to the shape of channel 704

FIG. 7 is a cross-sectional view of Background Art FinFET 700 taken along line VII-VII' of FIG. 6. Recall that the inversion layer induced in a channel is located next to gate oxide 704 and tends to be rather shallow. An idealized effect of the fin-shaped channel 704 gate electrode 706 is as if three separate inversion layers are induced, namely a first inversion layer 708a, a second inversion layer 708b and a third inversion layer 708C. Hence, FinFET 700 is referred to as a triple-gate FinFET.

FIGS. 8A-8B are cross-sectional views of two stages in the manufacture of a multi-gate FinFET according to the Background Art. More particularly, FIGS. 8A-8B depict stages in the formation of the fin of the FinFET. In FIG. 8A, a silicon layer 220 is formed on a buried oxide (BOX) structure 210, which is formed on a silicon substrate 220. A silicon plug 810 is formed to fill an opening in oxide layer 510. Plug 810 is grown by selective epitaxial growth (SEG). In FIG. 8B, the portion of plug 810 extending above oxide 510 has been removed by CMP.

Returning to FIG. 7, as a practical matter, the electrostatic field induced by a voltage on gate electrode, e.g., 706, is not uniform along gate electrode 706. Rather, the electrostatic field tends to be concentrated in the corners, as indicated by the shaded regions 710a and 710b in FIG. 7. Consequently, inversion layers form in the corners before forming all along gate electrode 706. This lowers a threshold voltage for the corners relative to the sides, leading to higher current flow at the corners and generally non-uniform performance of the FinFET.

The Background Art recognized that such a corner phenomenon could be mitigated if the corners could be rounded. Accordingly, efforts have been made to remove material from the substantially square corners, e.g., by dry etching, in order to achieve an approximation of rounded corners. Despite many attempts, the Background Art has not been able to develop a technique to remove material from square corners of triple-gate FinFET 700 (or a double-gate version thereof) that does not irreparably damage the remaining portion of fin 702b or result in a non-uniform width thereof.

SUMMARY OF THE PRESENT INVENTION

At least one embodiment of the present invention provides an at least penta-sided-channel type of FinFET transistor. Such a FinFET may include: a base; a semiconductor body formed on the base, the body being arranged in a long dimension to have source/drain regions sandwiching a channel region, where at least the channel, in cross-section transverse to the long dimension, has at least five planar surfaces above the base; a gate insulator on the channel region of the body; and a gate electrode formed on the gate insulator.

At least one other embodiment of the present invention provides a method of forming an at least penta-sided-channel type of FinFET transistor. Such a method may include: providing a base; forming a fin on the base; epitaxially growing a body of semiconductor material, which includes a channel region, on the base, where at least the channel region, in cross-section transverse to a long dimension of the body, having five or more planar surfaces above the base; selectively doping the semiconductor body to produce, in the long dimension, source/drain regions sandwiching the channel region, forming a gate insulator on the channel region of the body; and forming a gate electrode formed on the gate insulator.

Additional features and advantages of the invention will be more fully apparent from the following detailed description of example embodiments, the accompanying drawings and the associated claims.

BRIEF DESCRIPTION OF THE DRAWINGS

The present invention will be described more fully with reference to the accompanying drawings, in which example embodiments of the present invention are shown.

Those figures not labeled as Background Art are intended to depict example embodiments of the present invention and should not be interpreted to limit the scope thereof. In the figures, the relative thicknesses and positioning of layers or regions may be reduced or exaggerated for clarity. In other words, the figures are not drawn to scale. Further, a layer is considered as being formed "on" another layer or a substrate when formed either directly on the referenced layer or the substrate or formed on other layers or patterns overlaying the referenced layer.

It should be understood that example embodiments of the present invention described herein can be modified in form and detail without departing from the spirit and scope of the invention. Accordingly, the embodiments described herein are provided by way of example and not of limitation, and the scope of the present invention is not restricted to the particular embodiments described herein.

Figure 1:
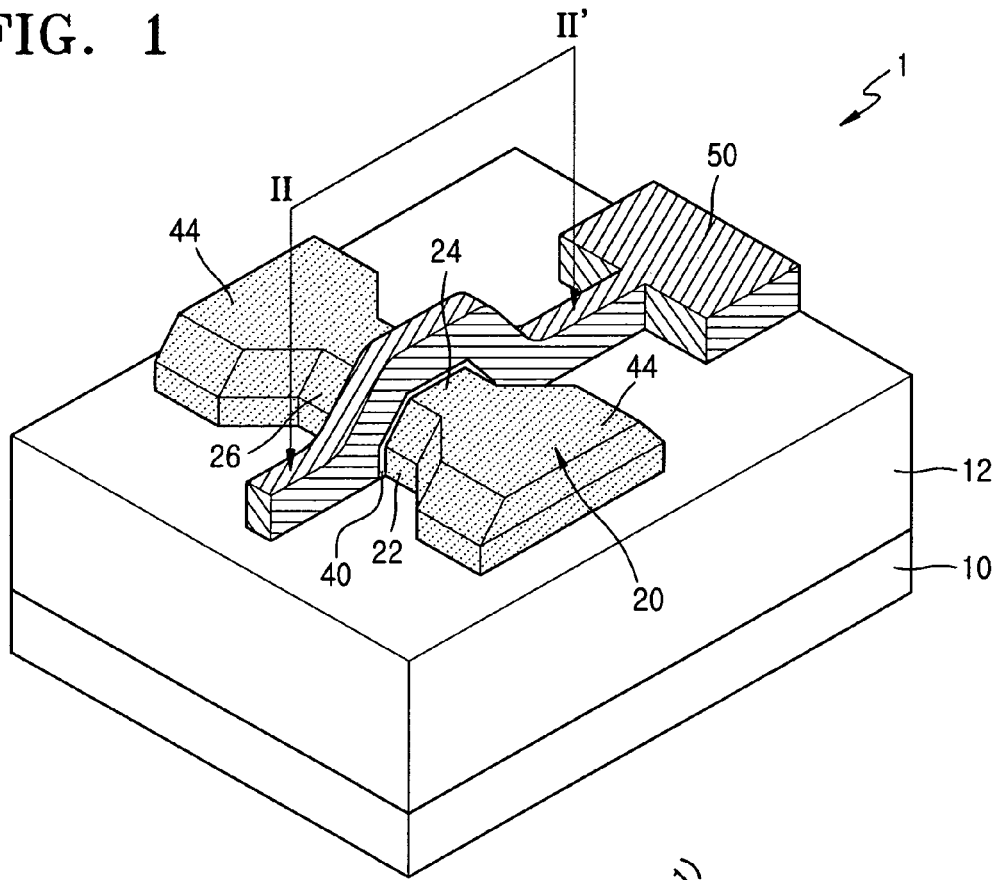

FIG. 1 is a three-quarter perspective view of an at least penta-sided-channel type of FinFET transistor, according to at least one embodiment of the present invention.

Figure 2A:
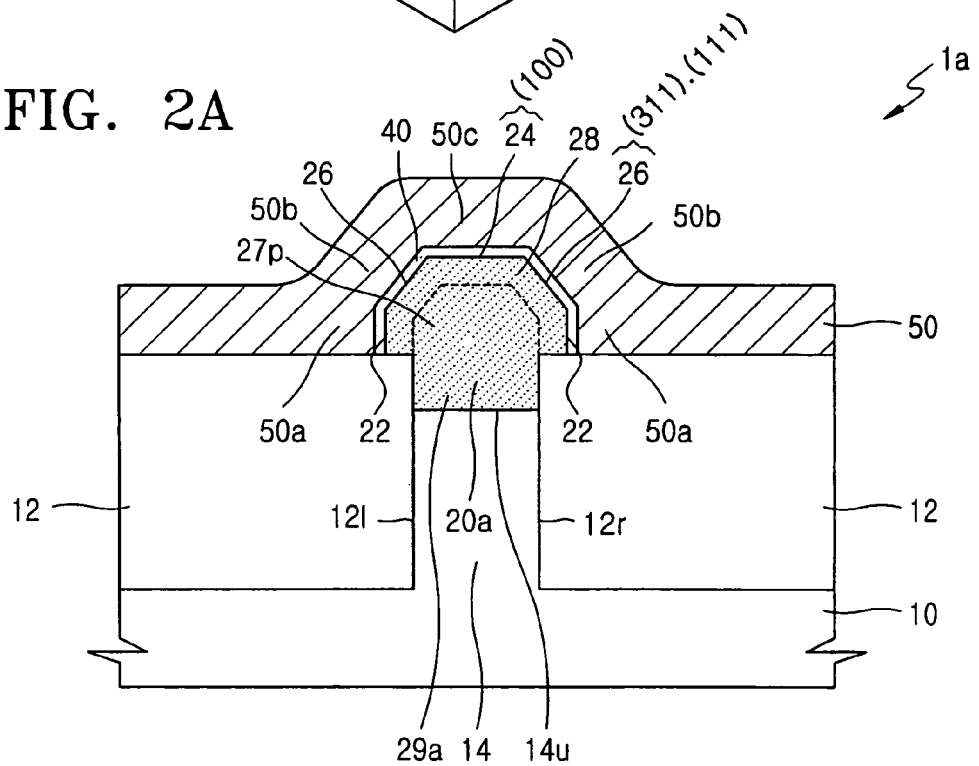

FIG. 2A is a cross-sectional view (taken along line II-II' of FIG. 1) of a first variety $1a$ of FinFET transistor $1$, according to at least one other embodiment of the present invention.

FIGS. 2B-2E are cross-sectional views (also taken along line II-II' of FIG. 1) of other varieties $1X$ (where $X\epsilon\{B,C,D,E\}$) of FinFET transistor $1$, according to other embodiments of the present invention, respectively.

Figure 2B:
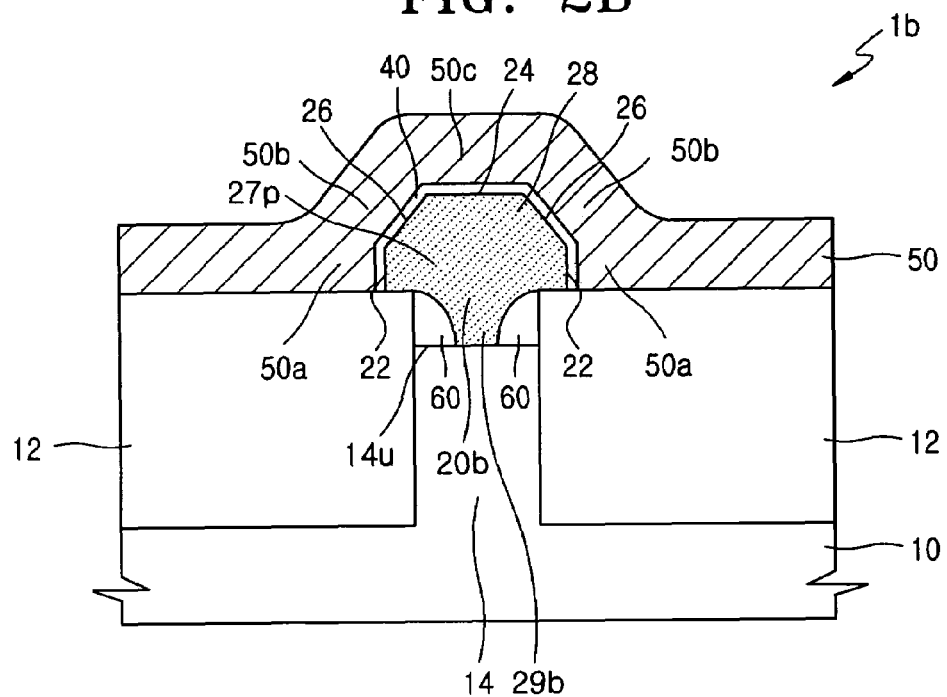

FIGS. 3A-3H are cross-sectional views (from the same perspective of FIG. 2B) that depict various stages of a method, according to at least one embodiment of the present invention, of making the FinFET of FIG. 2B.

Figure 2C:
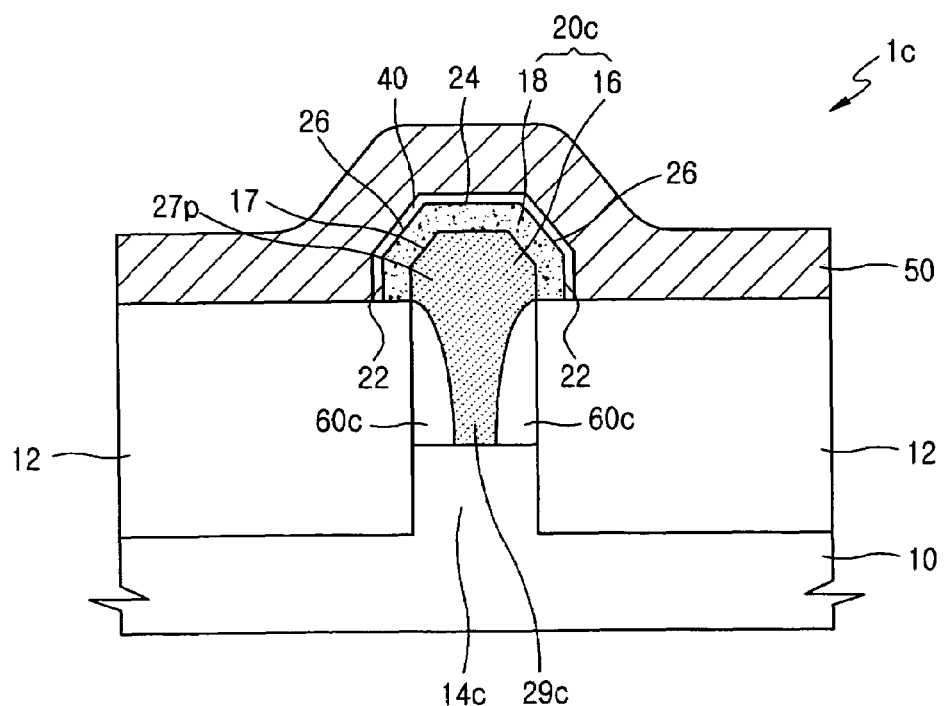
Figure 2D:
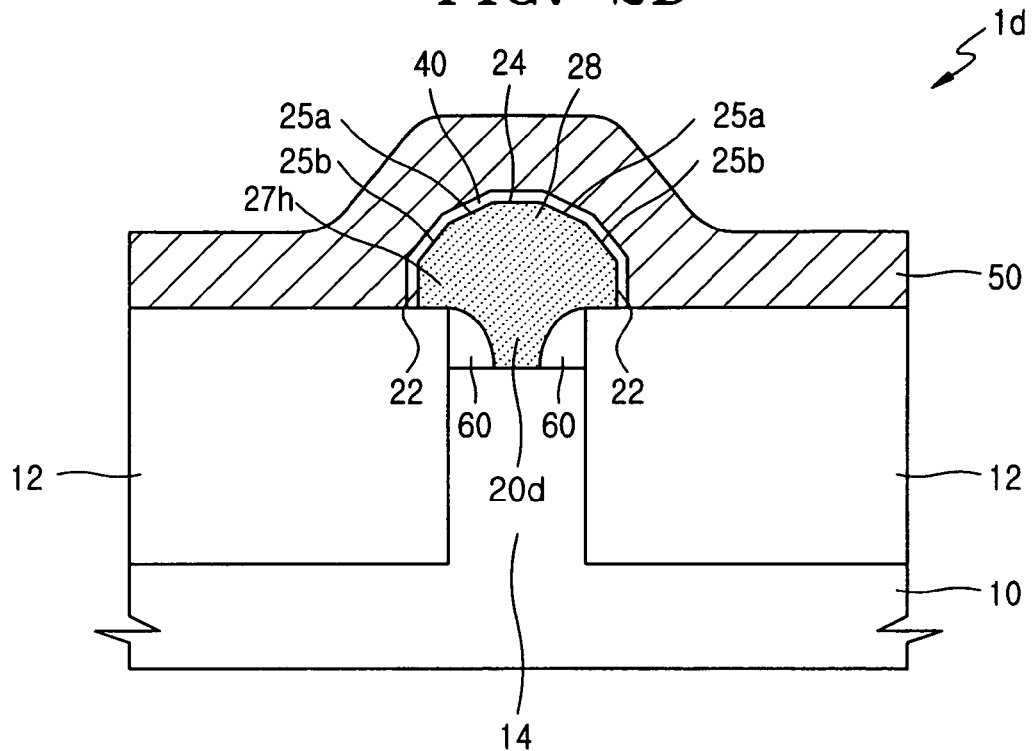
Figure 2E:
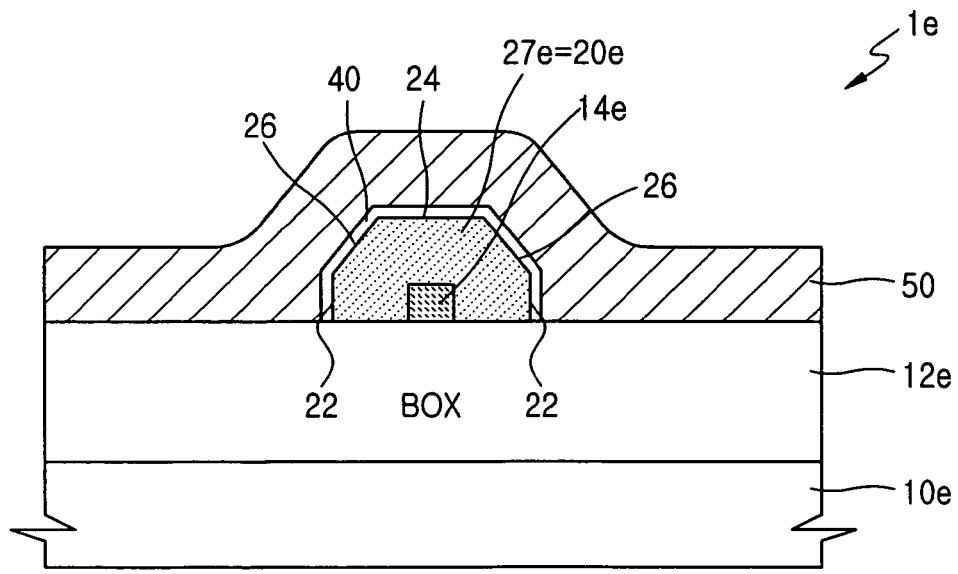
Figure 4A:
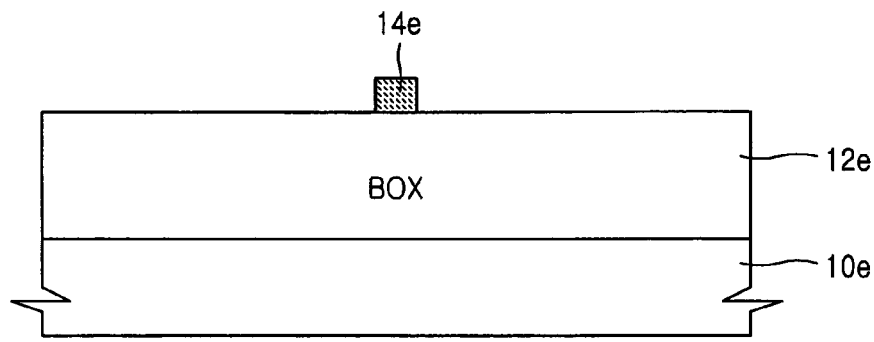
Figure 4B:
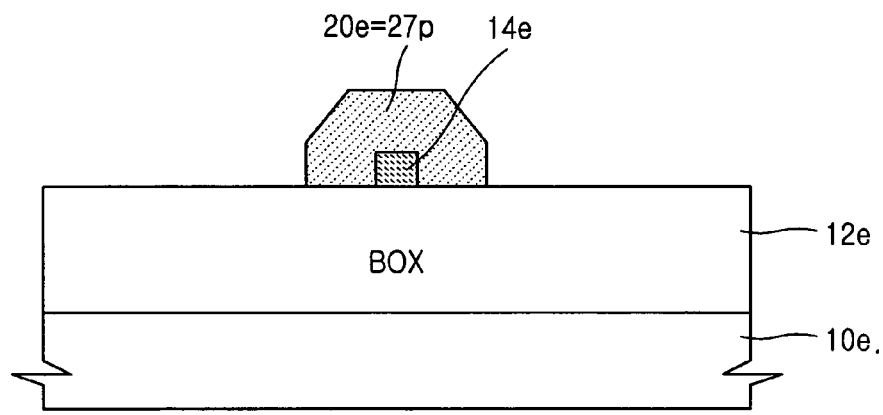
Figure 4C:
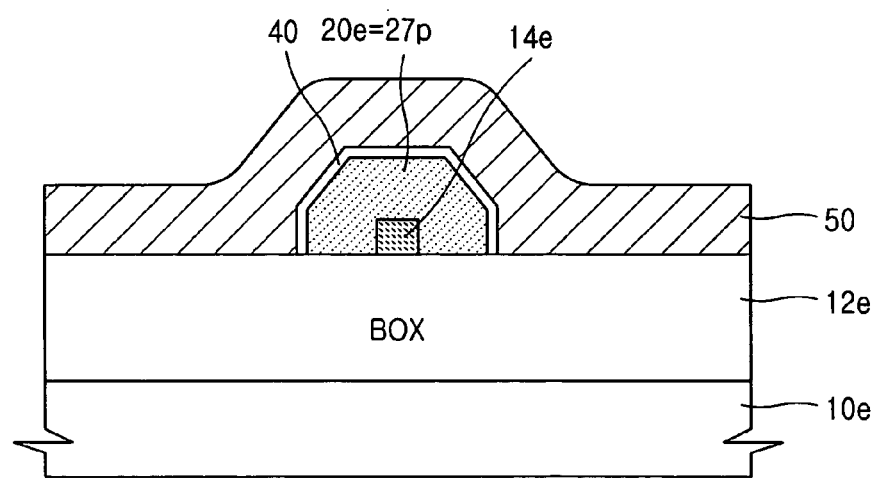

FIGS. 4A-4C are cross-sectional views (from the same perspective of FIG. 2E) that depict various stages of a method, according to at least one embodiment of the present invention, of making the FinFET of FIG. 2E.

Figure 5A:
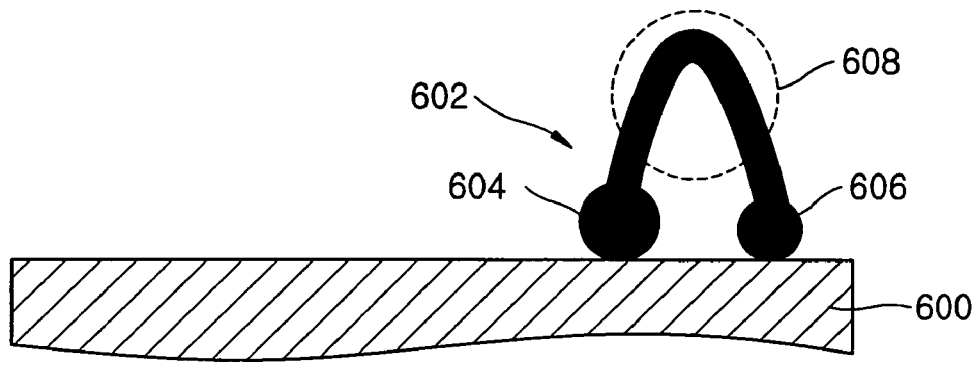
Figure 5B:
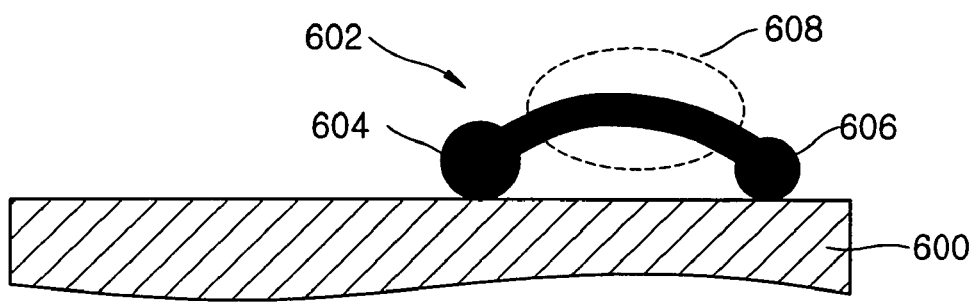
Figure 5C:
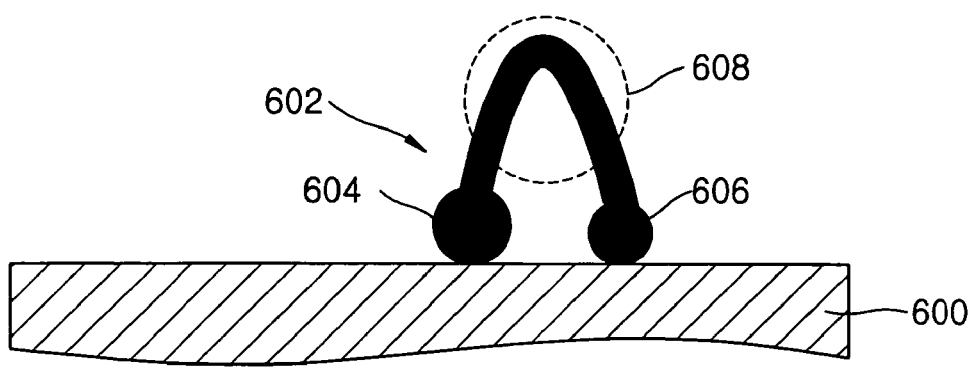

FIGS. 5A-5C are side views that depict stages of the peculiar form of locomotion used by an inchworm, which are presented as background information for an analogy to a FinFET according to the Background Art.

Figure 6:
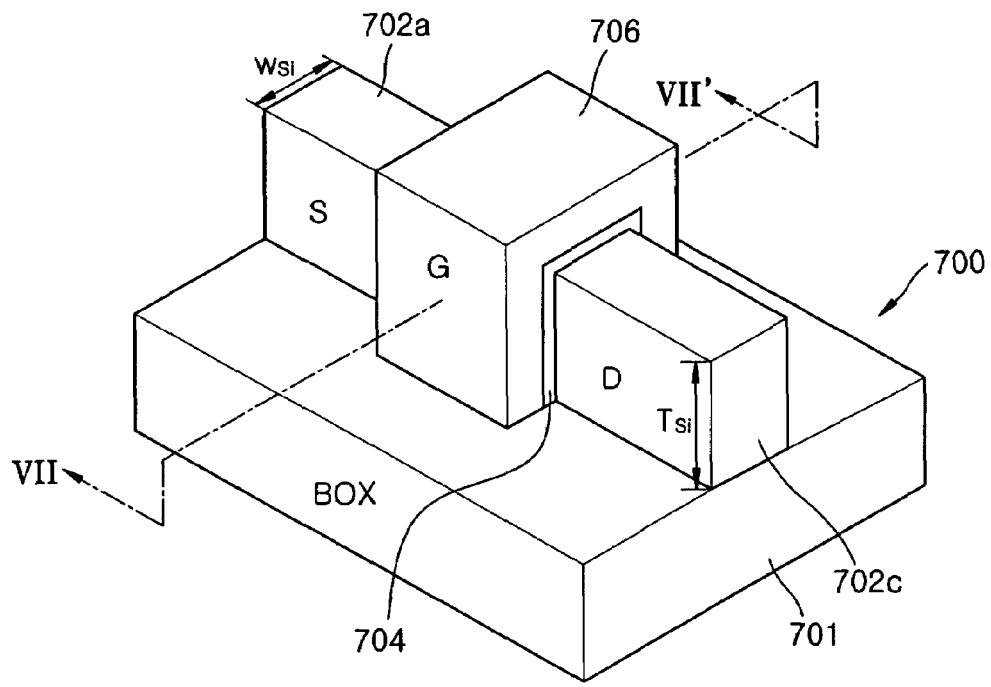

FIG. 6 is a three-quarter perspective view of a FinFET according to the Background Art.

Figure 7:
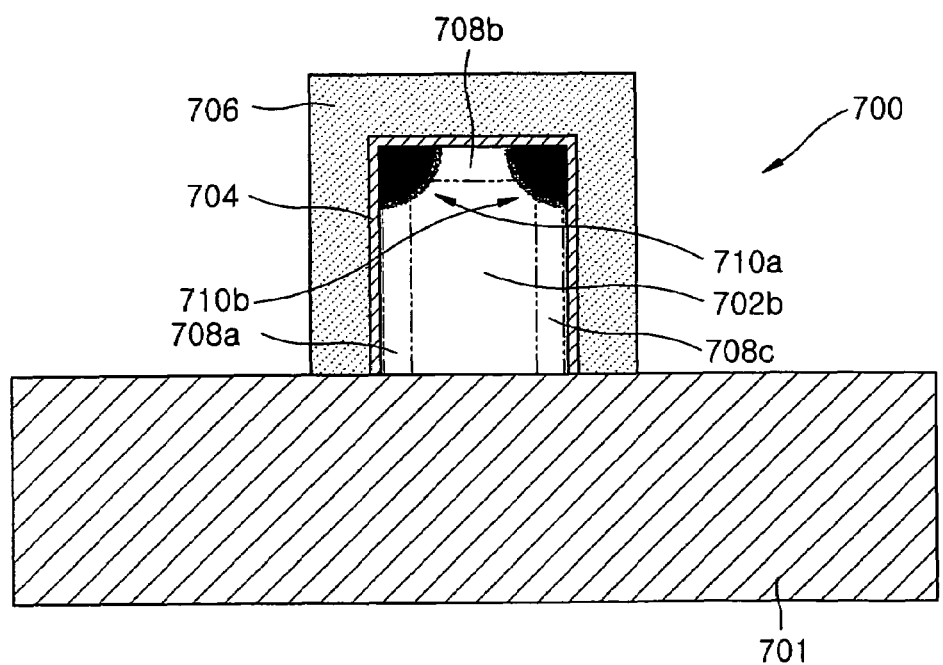

FIG. 7 is a cross-sectional view of the Background Art FinFET of FIG. 6, taken along line VII-VII'.

Figure 8A:
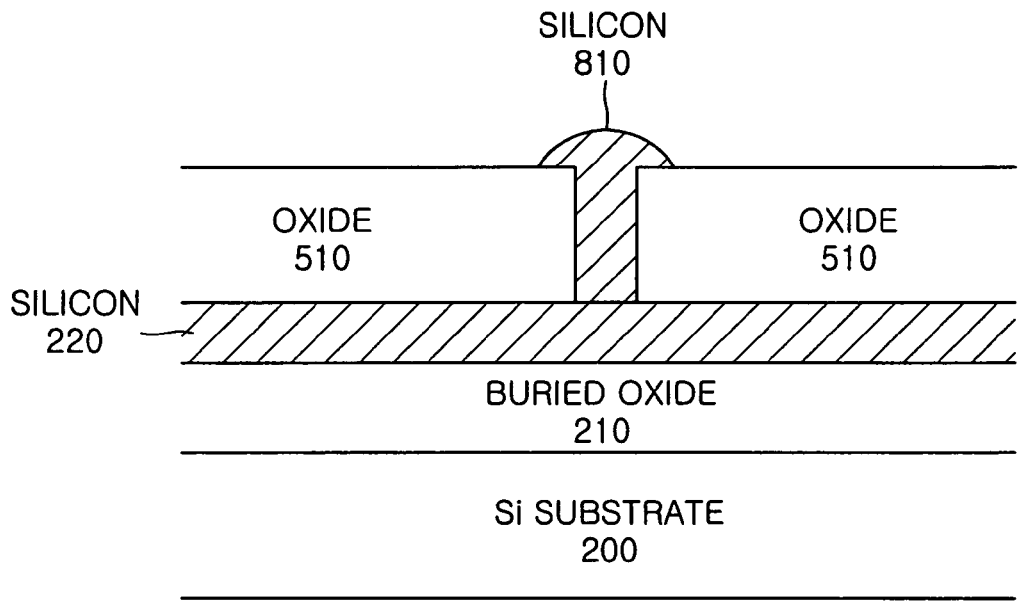
Figure 8B:
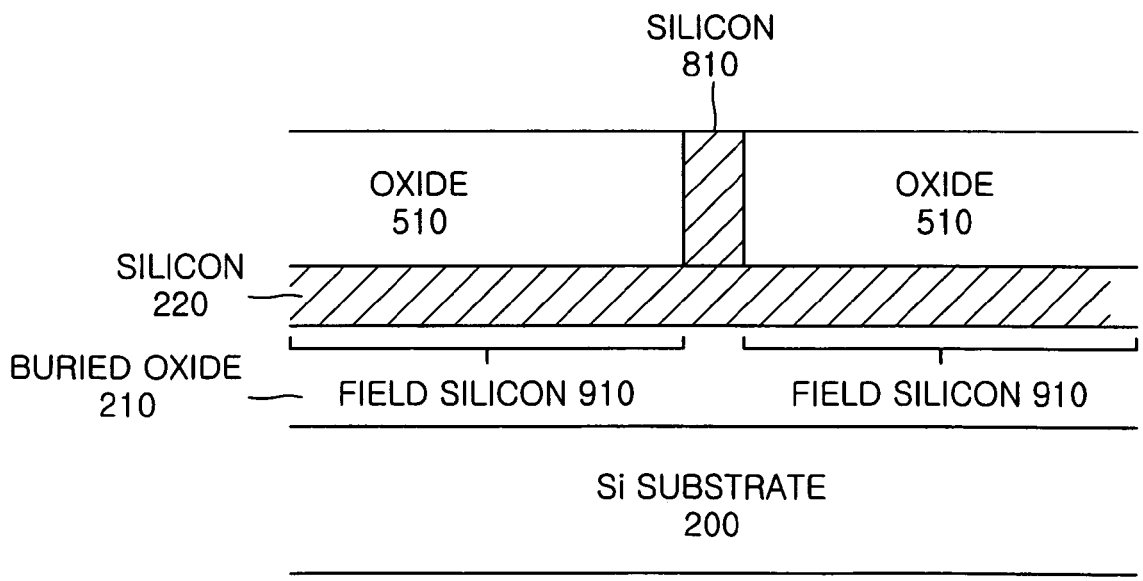

FIGS. 8A-8B are cross-sectional views of two stages in the manufacture of a multi-gate FinFET, according to the Background Art.

DETAILED DESCRIPTION OF EXAMPLE EMBODIMENTS

In developing the present invention, the following problem with the Background Art was recognized and a path to a solution identified. The Background Art assumes that mitigation (by rounded-corner approximation) of the problematic corner effect (again, caused by substantially square corners of the fin-shaped channel) of a Background Art FinFET can only be accomplished subtractively by removing material representing the substantially square portion of the corners. It is now recognized that an obtuse angle significantly larger than 90° can significantly reduce the corner effect. Such an obtuse angle approximates the rounding of corners, but can be achieved additively by growing the fin rather than subtractively by removing material from a fin having substantially square corners. For example, epitaxial growth of silicon can achieve the desired approximation of a rounded-corner fin without the negative consequential effects upon other aspects of the inchoate FinFET that are consequences of the Background Art techniques for subtractively approximating rounded corners of a fin. At least one embodiment of the present invention provides a multiple sided channel FinFET having approximated rounded corners for the fin-shaped body (in which the channel is induced) by additively constructing, e.g., growing, a body of semiconductor material into the desired shape.

FIG. 1 is a three-quarter perspective view of an at least penta-sided-channel type of FinFET transistor $1$, according to at least one embodiment of the present invention. FIG. 2A is a cross-sectional view (taken along line II-II' of FIG. 1) of a first variety $1a$ of at least the penta-sided-channel-type FinFET transistor $1$, according to at least one other embodiment of the present invention. FIGS. 2B-2E are cross-sectional views (also taken along line II-II' of FIG. 1) of other varieties $1X$ (where $X\epsilon\{B,C,D,E\}$) of FinFET transistor $1$, according to other embodiments of the present invention, respectively, that will be discussed below.

Transistor $1$ includes: a substrate $10$; an isolation region $12$; a fin $14$ (obscured in FIG. 1, but see, e.g., FIG. 2A); a body $20$ of semiconductor material, the body having two substantially vertical (relative to substantially horizontal isolation region $12$) facets $22$, a substantially horizontal facet $24$, and two beveled (again, relative to isolation region $12$) facets $26$; a channel $28$ (obscured in FIG. 1, but see, e.g., FIG. 2A); a gate insulating layer $40$; source/drain regions $44$; a gate electrode $50$ having two instances of a first gate regions $50a$, two instances of a second gate region $50b$, and one instance of a third gate region $50c$.

In FIG. 2A, a penta-sided inversion layer (or, in other words, a penta-sided channel) is induced in the mushroom-shaped portion $20a$ of body $20$ of FinFET transistor $1a$. In the cross-sectional perspective of FIG. 2A (and FIGS. 2B-2E as well), it is to be noted that channel $20a$ is depicted as being transverse to a long dimension of body $20$, where body $20$ also contains source/drain regions $44$. Portion $20a$ of body $20$ has a penta-sided head portion $27p$ (where the suffix "p" is suggestive of the prefix penta-) and a stalk portion $29A$. Stalk portion $29A$ extends down into and fills a recess defined by sidewalls $12L$ and $12R$ of isolation region $12$ and an upper surface $14u$ of fin $14$. As part of body $20$, penta-sided head portion $27p$ exhibits five facets that can be described as being located above isolation region $12$, namely: two instances of substantially vertical facet $22$; one instance of substantially horizontal facet $24$; and two instances of beveled facet $26$. The five gate electrode regions $50a$, $50b$, $50c$, $50b$ and $50a$ can induce five inversion regions in body $20a$, which in effect represent five channels. Obtuse angles between facets $22$ & $26$ and $26$ & $24$ are substantially greater, respectively, than the 90° angles exhibited by the corners according to Background Art FinFET $700$, hence the problems associated with the corner effect are at least substantially reduced.

Substrate $10$ can include, e.g., one or more of {100} bulk Si, Si, Ge, SiGe, GaP, GaAs, SiC, SiGeC, InAs, InP, etc. Semiconductor body $20$ can include, e.g., one or more of Si, Ge, SiGe, SiC, SiGeC, etc. (discussed further below). Gate insulating layer $40$ can include, e.g., one or more of $SiO_2$, $SiON$, $Si_3N_4$, $Ge_xO_yN_z$, $Ge_xSi_yO_z$, high-k metal oxide (e.g., $HfO_2$, $ZrO_2$, $Al_2O_3$, $TiO_2$, $Ta_2O_5$, etc.), etc. or a stacked structure thereof. And gate $50$ can include one or more of doped poly-Si, metal (e.g., Al, W, Pt, etc.), metal nitride (e.g., TiN) metal (e.g., Co, Ni, Ti, Hf, Pt) silicide alloy, etc. or a stacked structure thereof.

FIG. 2B is a cross-sectional view (again, taken along line II-II' of FIG. 1) of a second variety $1b$ of at the at-least-penta-sided-channel-type FinFET transistor $1$, according to at least one other embodiment of the present invention. FinFET $1b$ is similar to FinFET $1a$, so minimal discussion of similarities is presented for the sake of brevity. For example, while stalk portion 29a of FinFET 1a is substantially rectangular in cross-section, stalk 29b of FinFET 1b is tapered by contrast. Sidewall spacers 60 partially fill the recess defined by sidewalls of isolation region 12 and upper surface 14u of fin 14. However, a portion of upper surface 14u is not covered by sidewall spacers 60, but instead is covered by the smaller end of stalk portion 29A.

The five facets of head portion 27p of FinFETs 1a and 1b are obtained by growing bodies 20a and 20b, e.g., via selective epitaxial growth (SEG). Faceting morphology of head portion 27p, in terms of Miller indices, can include: horizontal facet 24 exhibiting plane (100); and beveled facets 26 exhibiting plane (311) or (111). Together, the five facets define a silhouette in FIG. 2B (and FIG. 2A) that approximates a fin having substantially rounded corners, as contrasted with fin 702b according to the Background Art. In other words, above isolation region 12, head portion 27p has a polygonal silhouette having five or more sides.

Figure 3A:
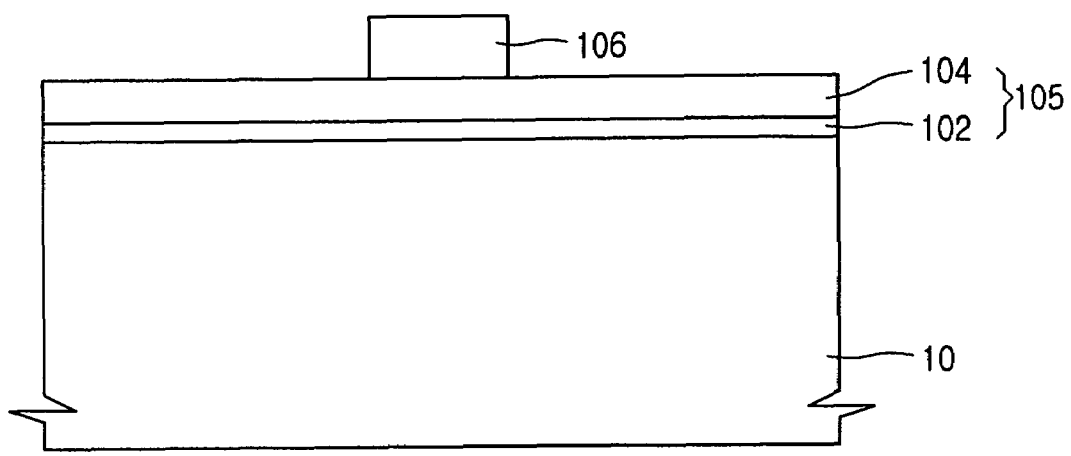

FIGS. 3A-3H are cross-sectional views (from the same perspective of FIG. 2B) that depict various stages of a method, according to at least one embodiment of the present invention, of making FinFET 1b. In FIG. 3A, substrate 10 as been provided. An oxide layer 102 has been formed on substrate 10. A silicon nitride layer 104 has been formed on oxide layer 102. Together, layers 102 and 104 define a mask layer 105. A photo-resist (PR) material has been deposited on mask layer 105 and patterned into PR pattern 106.

Figure 3B:
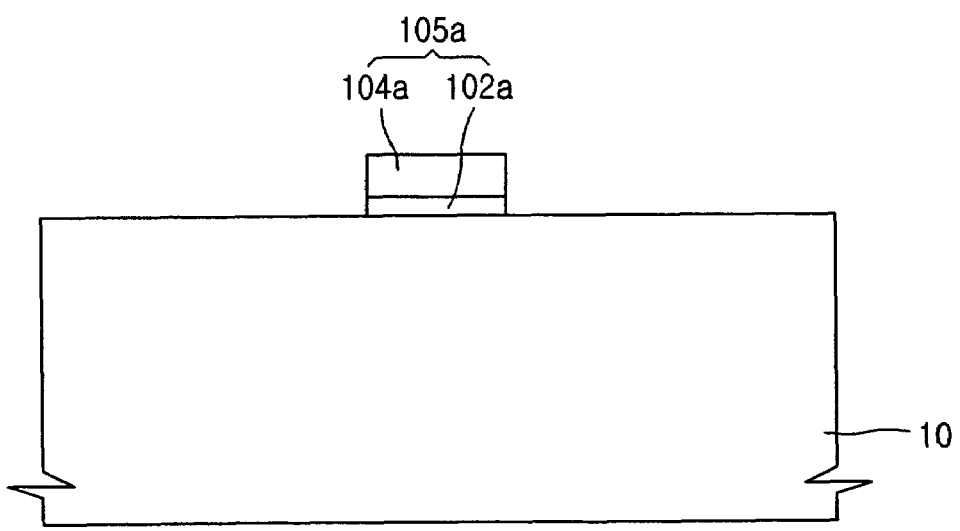
Figure 3C:
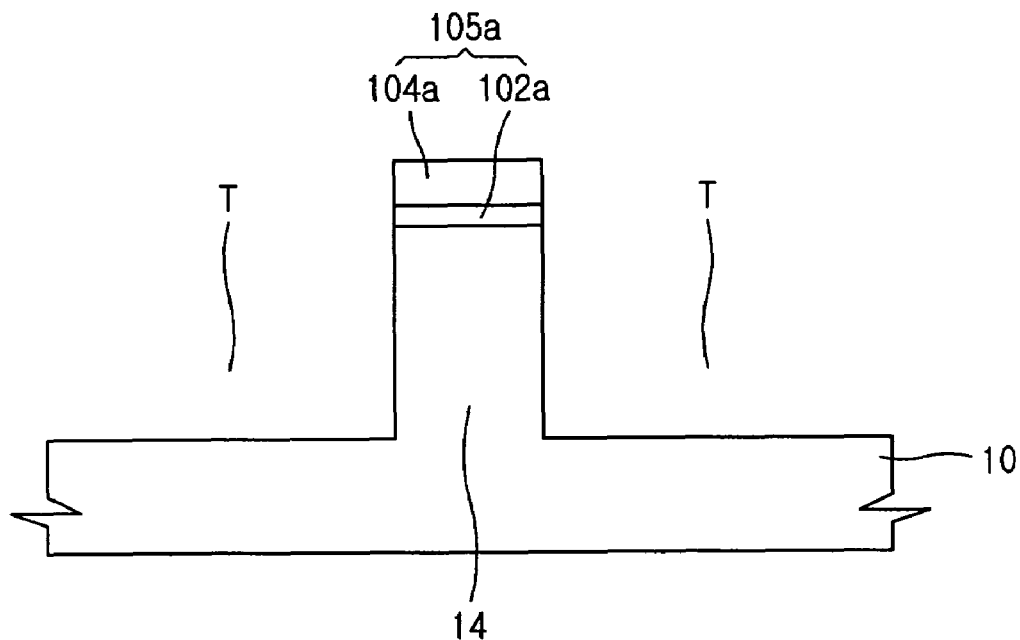

Between what is depicted in FIGS. 3A and 3B, mask layer 105 is selectively removed everywhere except for underneath PR pattern 106. Then PR pattern 106 is itself removed. FIG. 3B depicts what remains thereafter, namely a mask 105a formed of layer segments 104a and 102a. Next, in FIG. 3C, portions of substrate 10 have been selectively removed, causing substrate 10 to take on an inverted-T shape having a horizontal portion and fin 14 extending perpendicularly therefrom. As a result, one or more trenches T have been formed above the horizontal portion of substrate 10 and around the sides of fin 14.

Figure 3D:
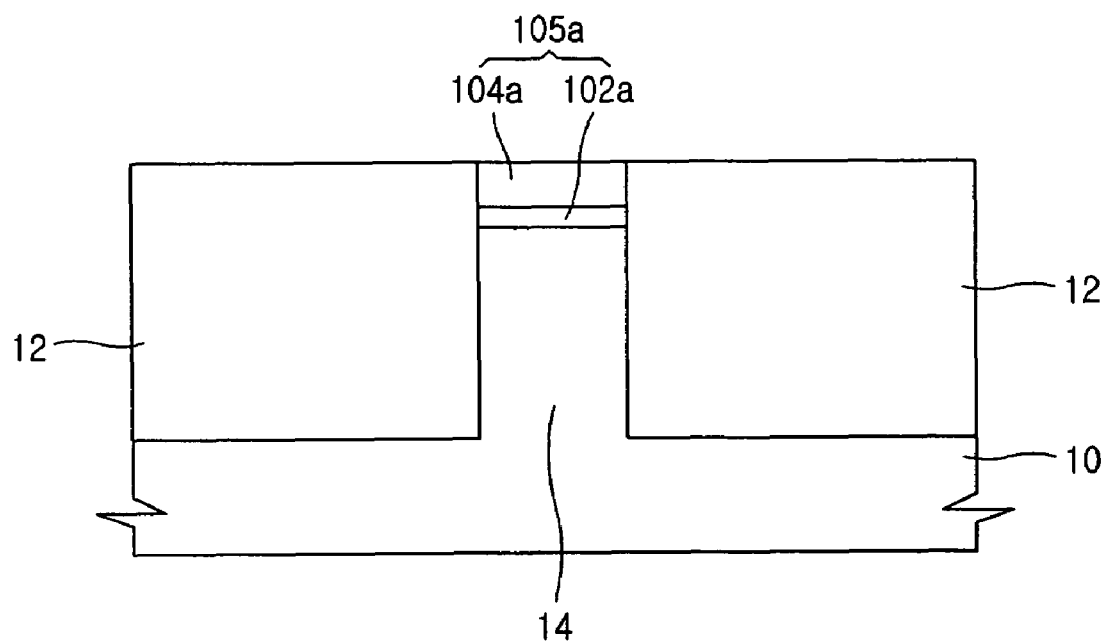
Figure 3E:
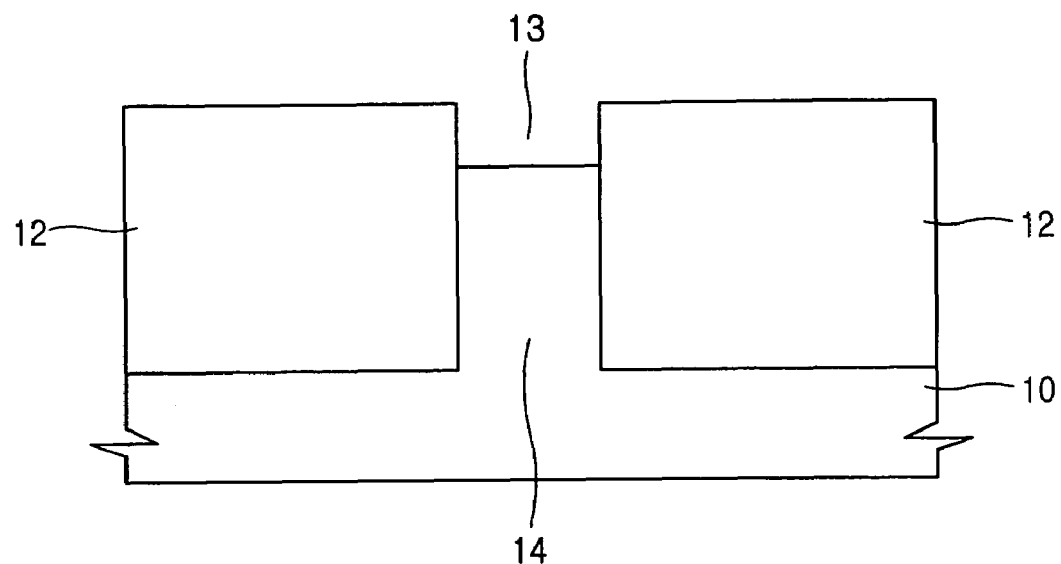

In FIG. 3D, isolation region 112 has been formed, e.g., by deposition of material to fill one or more trenches T. Also, optionally, isolation region 112 and mask 105a have been planarized. In FIG. 3E, mask 105a has been removed, e.g., by wet etching, leaving a recess 113 defined by the exposed sidewalls of isolation region 12 and an upper surface of fin 14.

Figure 3F:
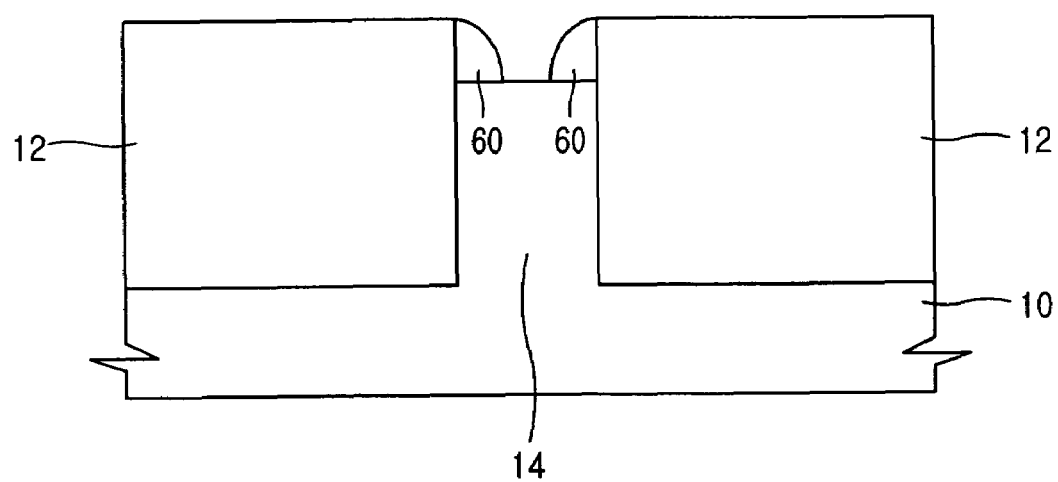

In FIG. 3F, optional sidewall spacers 60 have been formed against the formerly exposed sidewalls of isolation region 12 and on portions of the upper surface of fin 14. This can be done by filling recess 113 with a nitride or oxide material and then partially removing the material. The remaining filler material 60 takes on the appearance of sidewall spacers.

Figure 3G:
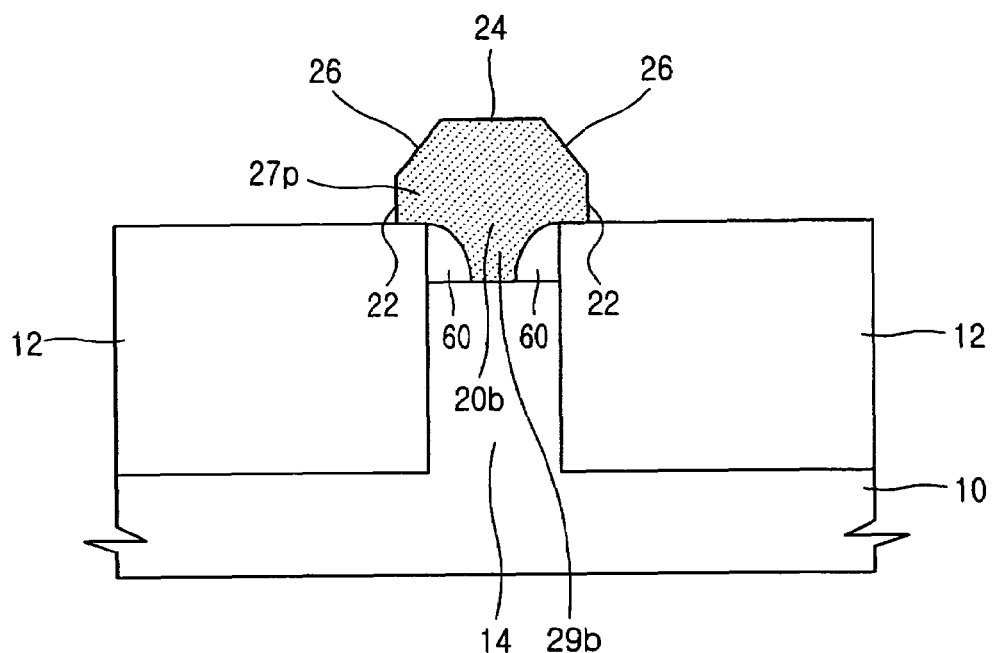
Figure 3H:
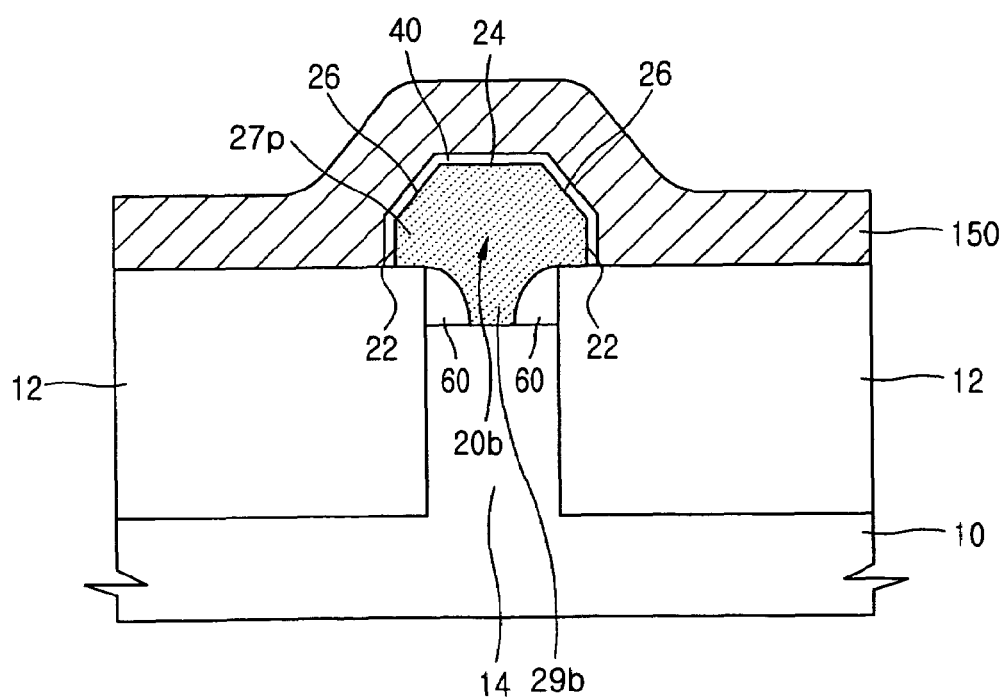

Between sidewall spacers 60, there remains an exposed upper surface of fin 14, which is the seed from which portion 20b (and thus body 20) of semiconductor material will be grown, e.g., via SEG. In FIG. 3G, portion 20b (and thus body 20) has been grown, e.g., (again) via SEG, such that it has penta-sided head portion 27p (with facets 22, 24 and 26) and stalk portion 29b. Also, ion implantation has been performed to obtain source/drain regions 44 (not shown in FIG. 3G, but see FIG. 1).

Generally, after the intermediate stage of FIG. 3G, standard CMOS processing occurs by which FinFET 1b is completed. For example, in FIG. 3H, a layer of insulating material has been formed on outer surfaces of penta-sided head portion 27p of portion 20b of body 20 that are located above isolation region 12 as well as on portions of the upper surface of isolation region 12. Those portions of the insulating material not contiguous with penta-sided head portion 27p have been selectively removed, which results in gate insulating layer 40. Also, gate electrode layer 150 has then been formed on gate insulating layer 40 and on portions of the upper surface of isolation region 12. Accordingly, the stage of FinFET manufacture depicted in FIG. 3H corresponds to FIG. 2B.

As noted, sidewall spacers 60 are optional. If sidewall spacers 60 are not formed (or, in other words, the stage depicted in FIG. 3F is omitted), then SEG can be performed on the intermediate structure of FIG. 3E, so that the subsequent processing associated with FIGS. 3G and 3H would produce FinFET 1a instead of FinFET 1b.

While SEG-process parameters can be controlled to manipulate the growth of body 20a or 20b so that penta-sided head portion of 27p results, different measures are needed to control an overall size of body 20 (and thus a scale of FinFET 1a or 1b). The surface area of the seed upon which SEG takes place is proportional to the overall size of resulting body 20. Accordingly, the use of sidewall spacers 60 represents a technique to reduce an overall size that body 20 (and therefore FinFET 1b) can obtain. More particularly, the seed area of FIG. 3E is larger than the seed area of FIG. 3F, hence for similar SEG parameters, portion 20b of body 20 would be expected to be smaller than portion 20a of body 20.

Regardless of whether or not sidewall spacers 60 are used, the SEG process can include the following. The exposed upper surface 14u of fin 14 is cleaned via, e.g., the RCA cleaning technique, which uses a mixture of $H_2SO_4$, HCl, $NH_4OH$, HF and $H_2O_2$ to remove native oxide from the seed. Then the SEG process can begin. For example, temperatures can range between about 500° C. to about 900° C., pressures can range between about 5 to about 100 Torr, and dichlorosilane (DCS) gas can be used as the atmosphere in which growth takes place. When inchoate bodies 20a and 20b respectively grow beyond the confines of the sidewalls of isolation region 12, the surfaces of crystal lattice growth are substantially planar. For SEG conditions in which the temperature is T<800°, beveled facet 26 will typically exhibit plane (111). For SEG conditions in which the temperature is T>900°, beveled facet 26 will typically exhibit plane (311). For temperatures T in the range $800° \leq T \leq 900°$, see the discussion below of FIG. 2D.

FIG. 2C is a cross-sectional view (again, taken along line II-II' of FIG. 1) of a third variety 1c of the at-least-penta-sided-channel-type FinFET transistor 1, according to at least one other embodiment of the present invention. FinFET 1c is similar to FinFET 1b, so minimal discussion of similarities is presented for the sake of brevity. For example, while portion 20b of body 20 of FinFET 1b is formed of substantially one material, corresponding portion 20c of body 20 of FinFET 1c includes two materials, namely a mound 16 of strain-inducing semiconductor material and a layer 18 of strained semiconductor material. As is known, an advantage of strained semiconductor material, e.g., silicon, is that it exhibits reduced resistance to electron/hole mobility.

Mound 16 of strain-inducing material can be described as a smaller version of portion 20b of body 20. Gas components of the atmosphere provided for the SEG process are changed once mound 16 has reached a desired size, resulting in the formation of a heterogeneous border 17 and then the formation of layer 18 of the strained semiconductor material. Appropriate selection of the respective materials for mound 16 and layer 18 can induce either tensile or compressive stress in layer 18.

To induce tensile stress in layer 18, the following combinations of semiconductor materials can be used.

| strain-inducing (mound 16) | strained (layer 18) |
| --- | --- |
| SiGe | Si |
| Si | SiC |
| SiGe | SiC |
| $Si_{1-X1-Y1}Ge_{X1}C_{Y1}$, where $0 < X1 < 1$ and $0 < Y1 < 1$ | $Si_{1-X2-Y2}Ge_{X2}C_{Y2}$, where $0 < X2 < 1$, $0 < Y2 < 1$, $X1 > X2$ and $Y1 < Y2$ |

To induce compressive stress in layer 18, e.g., in the circumstance of forming a PMOS FinFET, the following combinations of semiconductor materials can be used.

| strain-inducing (mound 16) | strained (layer 18) |
| --- | --- |
| Si | SiGe |
| SiC | Si |
| SiC | SiGe |
| $Si_{1-X2-Y2}Ge_{X2}C_{Y2}$, where $0 < X2 < 1$, $0 < Y2 < 1$, $X1 > X2$ and $Y1 < Y2$ | $Si_{1-X1-Y1}Ge_{X1}C_{Y1}$, where $0 < X1 < 1$ and $0 < Y1 < 1$ |

In the alternative, FinFET 1b of FIG. 2B can be constructed with a strained channel. There, fin 14 could be formed of strain-inducing material and body 20 could be formed of strained material.

FIG. 2D is a cross-sectional view (again, taken along line II-II' of FIG. 1) of a fourth variety 1d of FinFET transistor 1, according to at least one other embodiment of the present invention. FinFET 1d is similar to FinFET 1b, so minimal discussion of similarities is presented for the sake of brevity. FinFET 1 has been described as an at-least-penta-sided-channel type of FinFET. Inspection of FIGS. 2D reveals that FinFET 1d is an at least hepta-sided-channel-type of FinFET.

As noted above in the discuss above of FinFET 1b, when inchoate body 20d grows using the sidewalls of isolation region 12, the growth surfaces are substantially planar. For SEG conditions in which the temperature T is in the range $800° \leq T \leq 900°$, hepta-sided head region 27h results (where the suffix "h" is suggestive of the prefix hepta-). More particularly, instead of having beveled facets 26 as with penta-sided head region 27p of FinFET 1b, hepta-sided head region 27h instead includes beveled facets 25a and 25b. In other words, faceting morphology of head portion 27h, in terms of Miller indices, can include: horizontal facet 24 exhibiting plane (100); first beveled facets 25a exhibiting one of plane (311) or (111); and second beveled facets 25b exhibiting the other of plane (311) or (111), respectively. Just as FinFETs 1a, 1b and 1c are described as having five channels, FinFET 1d can be described as having seven channels beneath its seven facets, namely, 22, 25a, 25b, 24, 25b, 25a and 22. Above isolation region 12, head portion 27h has a polygonal silhouette having six or more sides.

By appropriately adjusting temperature during the SEG process, hepta-sided head region 27h (and consequently FinFET 1d) can be formed. The ordinarily-skilled artisan can easily adapt the method illustrated in FIGS. 3A-3G to obtain FinFET 1d. It is noted that at least hepta-sided-channel-type alternative versions of FinFET 1a (again, no spacers 60) and FinFET 1c (strained semiconductor architecture) can also be formed. The ordinarily-skilled artisan can easily adapt the method illustrated in FIGS. 3A-3G to obtain such at least hepta-sided-channel-type alternative FinFETs.

FIG. 2E is a cross-sectional view (again, taken along line II-II' of FIG. 1) of a fifth variety 1e of the at-least-penta-sided-channel-type FinFET transistor 1, according to at least one other embodiment of the present invention. Varieties 1a-1d of FinFET 1 can be described as bulk silicon process types of FinFET, FinFET 1e can be described as a silicon on insulator (SOI) type of FinFET.

FinFET 1e is similar to FinFET 1a, so minimal discussion of similarities is presented for the sake of brevity. While FinFET 1a has a substrate 10 configured like an inverted-T shape having a horizontal portion and fin 14 extending perpendicularly therefrom, etc., by contrast FinFET 1e instead includes: a substantially planar substrate 10e; and buried oxide (BOX) layer 12e; a semiconductor fin 14e; and a penta-sided head region 27p that (in the example of FIG. 2e) substantially constitutes the entirety of a portion 20e of body 20. Faceting morphology of head portion 27p in FIG. 2E again includes the same five facets, namely: vertical facets 22; horizontal facet 24; and beveled facets 26.

It is noted that, for both FinFET 1e and FinFET 1a, fin 14 and 14e can be described as having been formed upon a base. In FinFET 1a, the base is a bulk silicon base. In FinFET 1e, the base is an SOI base.

FIGS. 4A-4C are cross-sectional views (from the same perspective of FIG. 2E) that depict various stages of a method, according to at least one embodiment of the present invention, of making FinFET 1e. In FIG. 4A, semiconductor, e.g., silicon, substrate 10e has been provided. BOX 12e has been formed on substrate 10e. And fin 14e has been formed on BOX 12e. For example, fin 14e could be obtained by forming a silicon layer on BOX 12e and selectively removing a portion thereof, with the remainder being fin 14e. Similar to how the relative scale of FinFET 1a versus 1d is controlled by selecting the size of sidewall spacers 60 relative to a width of recess 113, a scale of FinFET 1e can be controlled by appropriately establishing a size of the footprint of fin 14e. In the cross-sectional view that is FIG. 2E, changing the footprint of fin 14e could be manifested as differing widths of fin 14e.

In FIG. 4B, head region 14e has been grown via, e.g., an SEG process similar to what has been discussed above regarding, e.g., FIG. 3G. Unlike portion 20b of body 20 of FIG. 3G, however, portion 20e of body 20 in FIG. 4B does not have a stalk 29b. Rather, fin 14e extends upward into penta-sided head region 29e. As noted, penta-sided head region 27p substantially constitutes the entirety of a portion 20e of body 20 (indicated in FIG. 2E with a lead line having the label 27e=20e). Alternatively, portion 20e could be implemented as a strained structure such as portion 20c of FIG. 2C and/or to instead include a hepta-sided head region 27h (not depicted) similar to head region 27h of FIG. 2D. The ordinarily-skilled artisan can adapt the explanation provided above to easily obtain such alternatives.

More particularly in FIG. 4C, body 20e has been grown, e.g., (again) via SEG, such that it has penta-sided head portion 27p. Also, ion implantation has been performed to obtain source/drain regions 44 (not shown in FIG. 4B, but see FIG. 1).

Generally, after the intermediate stage of FIG. 4B, standard CMOS processing occurs by which FinFET 1e is completed. As this is similar to what is described above regarding FIG. 3G, such discussion will not be repeated her for the sake of brevity. Accordingly, the stage of FinFET manufacture depicted in FIG. 4C corresponds to FIG. 2E.

To reiterate, embodiments of the present invention provide various multiple-sided-channel FinFETs that exhibit reduced symptoms of the corner effect, which can be achieved (according to other embodiments of the present invention) by additively constructing or building up, e.g., growing, a body of semiconductor material into an approximation of a fin having rounded corners. An advantage of such additive techniques is that they do not suffer the negative consequential effects, e.g., surface roughness arising from dry etching, upon the inchoate FinFET that are consequences of the Background Art techniques for subtractively obtaining an approximation of a rounded corner of a fin.

Another advantage of such additive techniques (according to embodiments of the present invention) is that the scale of the resulting FinFET is relatively easier to control as contrasted with the Background Art techniques mentioned above.

Of course, although several variances and example embodiments of the present invention are discussed herein, it is readily understood by those of ordinary skill in the art that various additional modifications may also be made to the present invention. Accordingly, the example embodiments discussed herein are not limiting of the present invention.

What is claimed is:

1. An at least penta-sided-channel type of FinFET transistor comprising:
a base including,
a base semiconductor structure having a fin extending perpendicularly therefrom and shoulder portions above which the fin extends, and
one or more isolation regions formed on the base semiconductor structure, the one or more isolation regions extending above the fin so as to define a recess in the one or more isolation regions above the fin;
a semiconductor body formed on the base, the semiconductor body being arranged in a long dimension to have source/drain regions sandwiching a channel region, the semiconductor body having a stalk portion extending down into and at least partially filling the recess, wherein
the channel region has at least five planar surfaces above the base,
at least two of the planar surfaces being beveled surfaces;
a gate insulator on the channel region of the body; and
a gate electrode formed on the gate insulator.

2. The FinFET transistor of claim 1, wherein:
the base includes
an inverted T-shaped semiconductor structure having a horizontal portion and a fin extending perpendicularly therefrom, and
one or more isolation structures formed on the horizontal portion of the inverted T-shaped semiconductor structure, the one or more isolation structures extending above the fin so as to define a recess in the one or more isolation structures above the fin;
the channel region of the body is located over the recess; and
the semiconductor body has a stalk that extends down into and at least partially fills the recess.

3. The FinFET transistor of claim 1, further comprising: sidewall spacers formed to at least partially fill the recess in the one or more isolation structures, the sidewall spacers being sized such that at least a portion of the fin remains exposed to the recess.

4. The FinFET transistor of claim 1, further comprising: sidewall spacers formed on the fin.

5. The FinFET transistor of claim 1, wherein the channel is strained.

6. The FinFET transistor of claim 5, wherein the base includes strain-inducing material and the semiconductor body includes strained material.

7. The FinFET transistor of claim 5, wherein the semiconductor body includes strained material and strain-inducing material.

8. The FinFET transistor of claim 5, wherein the cross-section of the channel includes at least seven planar surfaces.

9. The FinFET transistor of claim 8, further comprising: sidewall spacers formed on the fin.

10. The FinFET transistor of claim 9, wherein:
the sidewall spacers are sized such that at least a portion of the fin remains exposed to the recess.

11. The FinFET transistor of claim 1, wherein:
the base includes
a silicon on insulator (SOI) structure, and
a silicon fin formed on the SOI structure; and
the channel region is formed on the fin and the SOI structure.

12. The FinFET transistor of claim 11, wherein the channel includes at least seven planar surfaces.

13. The FinFET transistor of claim 11, wherein the channel is strained.

14. The FinFET transistor of claim 13, wherein the base includes strain-inducing material and the semiconductor body includes strained material.

15. The FinFET transistor of claim 13, wherein the semiconductor body includes strained material and strain-inducing material.

16. The FinFET transistor of claim 1,
wherein the at least two beveled surfaces exhibit at least one of a {1,1,1} surface and a {3,1,1} surface.

17. The FinFET transistor of claim 1, wherein:
the channel includes at least seven planar surfaces;
the base includes
a silicon on insulator (SOI) structure, and
a silicon fin formed on the SOI structure; and
the channel region is formed on the fin and the SOI structure.

18. The FinFET transistor of claim 1, wherein the channel includes at least seven planar surfaces.

19. The FinFET transistor of claim 18, wherein:
the base includes
an inverted T-shaped semiconductor structure having a horizontal portion and a fin extending perpendicularly therefrom, and
one or more isolation structures formed on the semiconductor layer, the one or more isolation structures extending above the fin so as to define a recess in the one or more isolation structures above the fin; and
the channel region of the body is located over the recess; and
the semiconductor body has a stalk extends down into and at least partially fills the recess.

20. The FinFET transistor of claim 1, wherein the stalk portion of the body has at least five planar surfaces above the base, at least two of the planar surfaces being beveled surfaces.

21. The FinFET transistor of claim 1, wherein the channel region is located over the recess and formed at least partially on the stalk-portion and at least partially on an upper surface of the one or more isolation regions.

22. An at least penta-sided-channel type of FinFET transistor comprising:
    a base;
    a semiconductor body formed on the base, the body being arranged in a long dimension to have source/drain regions sandwiching a channel region,
        wherein the channel has at least five planar surfaces above the base;
    a gate insulator on the channel region of the body; and
    a gate electrode formed on the gate insulator; wherein
        the channel region is formed of silicon,
        the at least five planar surfaces include at least two beveled surfaces,
        the at least two beveled surfaces exhibit at least one of a {1,1,1} surface and a {3,1,1} surface,
        the channel, in the cross-section, has at least seven planar surfaces,
        the at least seven planar surfaces include at least four beveled surfaces, and
        the at least four beveled surfaces exhibit both of the {1,1,1} and {3,1,1} surfaces.

23. The FinFET transistor of claim 22, wherein adjacent beveled surfaces alternate between being the {1,1,1} surface and the {3,1,1} surface.

24. The FinFET transistor of claim 23, further comprising: sidewall spacers formed on the fin.

25. The FinFET transistor of claim 23, wherein:
    the sidewall spacers are sized such that at least a portion of the fin remains exposed to the recess.

26. A multi-sided-channel FinFET transistor comprising:
    a base including,
        a base semiconductor structure having a fin extending perpendicularly therefrom and shoulder portions above which the fin extends, and
        one or more isolation regions formed on the base semiconductor structure, the one or more isolation regions extending above the fin so as to define a recess in the one or more isolation regions above the fin;
    a semiconductor body formed on the base, the semiconductor body being arranged in a long dimension to have source/drain regions sandwiching a channel region, and the semiconductor body having a stalk portion extending down into and at least partially filling the recess, the channel region having above the base a polygonal silhouette featuring five or more sides, at least two of the sides being beveled surfaces;
    a gate insulator on the channel region of the body; and
    a gate electrode formed on the gate insulator.

27. The FinFET of claim 26, wherein the polygonal silhouette has six or more sides.

* * * * *